(12) United States Patent
Saijyo et al.

(10) Patent No.: US 6,734,691 B2
(45) Date of Patent: May 11, 2004

(54) SUBSTRATE FOR A PROBE CARD HAVING CONDUCTIVE LAYERS FOR SUPPLYING POWER TO IC DEVICES

(75) Inventors: Masakatu Saijyo, Tokyo (JP); Yoshimi Nakamura, Tokyo (JP); Junichi Matsumoto, Tokyo (JP); Toshiaki Kato, Tokyo (JP); Shigeru Katakura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 39 days.

(21) Appl. No.: 10/231,076

(22) Filed: Aug. 30, 2002

(65) Prior Publication Data

US 2003/0057978 A1 Mar. 27, 2003

(30) Foreign Application Priority Data

Sep. 27, 2001 (JP) ........................................ 2001-296669

(51) Int. Cl.⁷ .............................................. G01R 31/02
(52) U.S. Cl. ..................... 324/762; 324/754; 324/158.1; 324/758
(58) Field of Search ................................. 324/754, 765, 324/158.1, 762, 758, 761, 755; 439/482, 700; 29/854, 574; 438/17, 18, 14; 257/48; 365/201

(56) References Cited

U.S. PATENT DOCUMENTS 4,719,417 A * 1/1988 Evans .......................... 324/762
5,818,249 A * 10/1998 Momohara .................. 324/762
6,204,674 B1 * 3/2001 Dabrowiecki et al. ...... 324/754

FOREIGN PATENT DOCUMENTS

JP          8008312          1/1996

* cited by examiner

*Primary Examiner*—David A. Zarneke
*Assistant Examiner*—Jimmy Nguyen
(74) *Attorney, Agent, or Firm*—Rabin & Berdo, PC

(57) ABSTRACT

A substrate for a probe card for use in testing semiconductor IC devices in a lump includes tester power supply terminals which receive a power supply voltage output from a tester. Power supply terminals are connected to a semiconductor IC device to be tested. At least two power supply layers each connect one of the tester power supply terminals to the power supply terminals.

18 Claims, 13 Drawing Sheets

US 6,734,691 B2

SUBSTRATE FOR A PROBE CARD HAVING CONDUCTIVE LAYERS FOR SUPPLYING POWER TO IC DEVICES

BACKGROUND OF THE INVENTION

1. Field of the Invention

The present invention relates to a substrate for a probe card used to test a plurality of semiconductor ICs (Integrated Circuits) in a lump.

2. Description of the Background Art

Referring to FIGS. 1 and 2, a conventional substrate for a probe card, generally designated with a reference numeral 1, is used to test a plurality of identical, semiconductor ICs (IC devices hereinafter) 2 formed on a wafer collectively. The probe card 1 includes a substrate 3 formed with a plurality of positioning holes 4. The positioning holes 4 are adapted to receive pins studded on a prober, not shown, to thereby position the probe card 1. The substrate 3 has tester terminals 5 formed thereon and connected to the test head of a tester, not shown, in order to transmit signals to and from the tester.

The substrate 3 includes a stack of layers 6, each of which has a particular pattern of electrically conductive material formed thereon. Those layers are referred to as signal layers. Those conductive patterns connect the tester terminals 5 to signal terminals 7 also formed on the substrate 3. Probe needles 9 for signals each are soldered or otherwise affixed to a particular needle seat portion 8 assigned to a signal. The needle seat portion 8 functions as transferring a signal from the signal terminal 7 to the probe needle 9. Each probe needle 9 includes a portion 9a covered with electrically insulative film and a contact portion 9b. The contact portion 9b has its tip contacting a pad positioned on associated one of the IC devices 2. In this condition, each probe needle 9 transfers a signal output from the tester to the associated IC device 2 and vice versa.

The substrate 3 has tester power supply terminals 10 formed thereon and connected to the tester head, so that a power supply voltage can be fed from the tester to the IC devices 2. The substrate 3 also includes an electrically conductive plate 11, which is divided into segments corresponding in number to the IC devices 2. In the specific, illustrative configuration, the conductive plate 11 is divided into eight segments in accordance with the number of IC devices 2 to be tested at the same time. The segments of the conductive plate 11 each connect the tester power supply terminals 10 to particular power supply terminals 12, which are arrayed on both sides of the test portion of the substrate 3, as seen in plan view of FIG. 1. The top and bottom surfaces in FIG. 2 of the conductive plate 11 are electrically insulated, so that the conductive plate 11 forms a power supply layer.

Further, probe needles 14 each are soldered or otherwise affixed to a particular needle seat portion 13 assigned to power supply. The needle seat portion 13 transfers an input voltage from the power supply terminal 12 to the probe needle 14. The probe needle 14 includes a portion 14a covered with electrically insulative film and a contact portion 14b. The contact portion 14b has its tip contacting a power supply pad 15 positioned on associated one of the IC devices 2, feeding a voltage input from the tester head to the probe needle 14. To the substrate 3, affixed is a probe holder 16 formed of a soft material. The probe needles 14 are inserted in the probe holder 16 and positioned thereby.

To test the IC devices 2 formed on the wafer in one lot, i.e. simultaneously, the probe needles 9 and 14 for signals and power supply are respectively brought into contact with the pads for signals, not shown, and the pads 15 for power supply, FIG. 1, of the IC devices 2. In this condition, a power supply voltage fed from the test head is received by the tester power supply terminals 10. The power supply voltage is then delivered from the power supply terminals 10 to the probe needles 14 via the conductive plate 11, power supply terminals 12, and needle seat portions 13. Finally, the power supply voltage is input to the IC devices 2 via the tips of the contact portions 14b contacting the power supply pads 15 of the IC devices 2.

Subsequently, a test signal is fed from the tester head to each IC device 2 via the associated tester terminal 5 for a signal, the conductive pattern provided on the associated signal layer 6, the signal terminal 7, the needle seat portion 8, the probe needle 9, and the signal pad of the IC device 2. The tester will then measure, e.g., a response time from sending the test signal to receiving a signal in response from the individual IC devices to determine whether or not the individual device are acceptable.

A current trend in the semiconductors art is toward the integration of many different kinds of devices including a memory and a CPU (Central Processing Unit) into a single IC device. This kind of IC device generally needs two or more different power supply voltages. FIG. 3 shows another conventional substrate for a probe card used to test such an IC device. In the figures, the same reference numerals designate the like elements. As shown, the probe card 1 is configured to test four IC devices 2 collectively, which are half as many as the IC devices 2 exemplarily shown in FIG. 1. A particular power supply voltage is applied to each of the upper and lower segments in the figure of the segmented conductive plate 11. In this condition, the tester, not shown, tests the individual IC devices 2 via the probe card 1 with different power voltages supplied.

FIGS. 4 and 5 show still another conventional substrate for a probe card. As shown, the probe card 1 is configured to test eight IC devices at a time, like the probe card 1 shown in FIG. 1. In this specific configuration, the conductive plate 11 is divided into sixteen segments, which are two times as many as the IC devices 2. A particular power supply voltage is applied to each of the right and left segments in FIG. 5 of the segmented conductive plate 11 via the power supply terminals 10 to thereby test the individual IC devices 2. As shown in FIG. 6, the probe card 1 can test even sixteen IC devices 2 simultaneously when the IC devices 2 are of the type fed with only a single power supply voltage.

The conventional probe cards 1 described above have the following problems left unsolved because they have only a single power supply layer each. When two different power supply voltages are necessary, use must be made of longer probe needles 14, as shown in FIG. 3. An increase in the length of each probe needle 14 directly translates into an increase in resistance and therefore in noise. This, coupled with a delay in response, makes the result of the test inaccurate and thereby reduces the number of accepted IC devices, decreasing the overall yield of IC devices. Moreover, it is likely that even acceptable IC devices are rejected.

Whereas the probe card 1 shown in FIG. 4 may solve the problem stated above, it needs a substitute substrate machined that would increase the test cost. Further, the substitute substrate needs a long production time and therefore lacks in adaptability. Moreover, when three or more different power supply voltages are required, the probe needles 14 must also be as long as the probe needles 14 shown in FIG. 3, reducing the yield of IC devices.

In an application where the same power supply voltage must be applied to two portions of each IC device to be tested, and an application where the same power supply voltage is fed from a left and a right conductive plate to the IC device via, e.g., the probe needle arrangement of FIG. 4 for promoting a wide use, any little difference between power supply voltages input to the two conductive plates would make the result of the test erroneous. To solve this problem, it was necessary to feed the power supply voltage from a single conductive plate as in the configuration shown in FIG. 1. It follows that a widely usable probe card adaptive to various kinds of IC devices with a single substrate was difficult to achieve.

SUMMARY OF THE INVENTION

It is an object of the present invention to provide a widely usable substrate for a probe card readily adaptive to various kinds of power supply voltages and various kinds of semiconductor IC devices with a single substrate.

A substrate for a probe card of the present invention includes a plurality of tester power supply terminals which receive a power supply voltage output from a tester. A plurality of power supply terminals are connected to a semiconductor IC device to be tested. At least two power supply layers each connect one of the tester power supply terminals to the power supply terminals.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
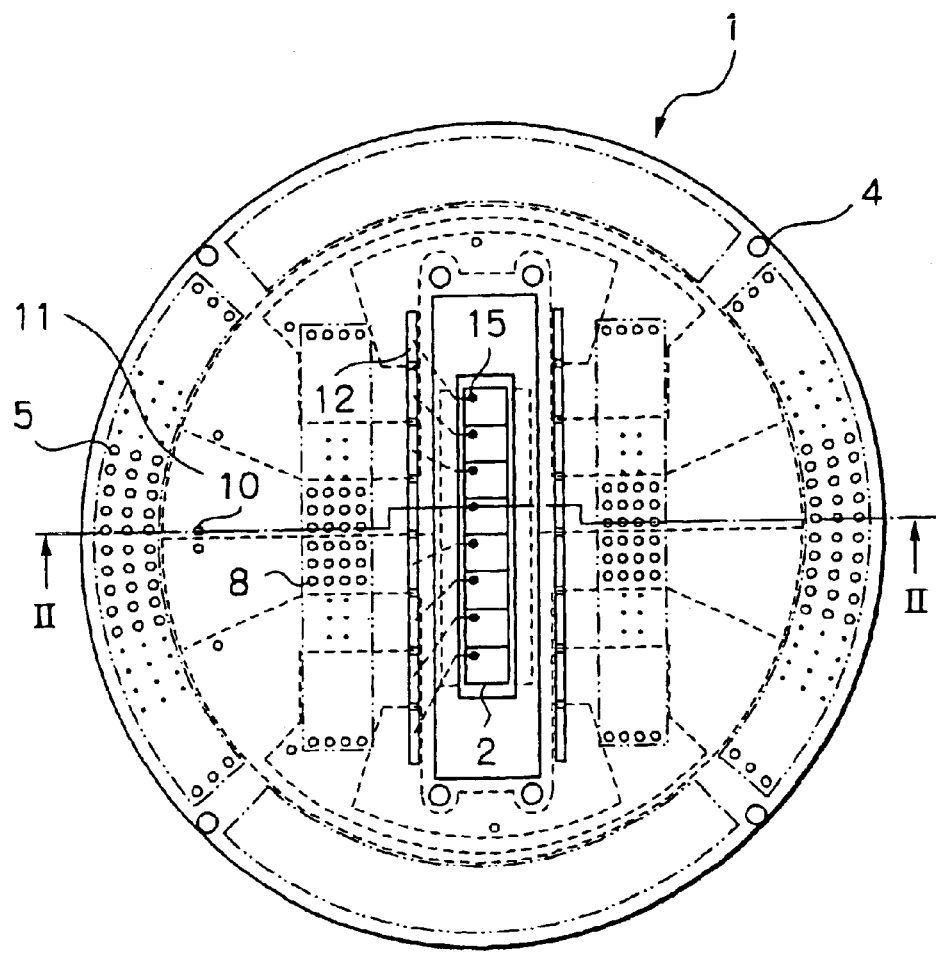
FIG. 1 is a schematic front view showing a conventional substrate for a probe card.
Figure 2:
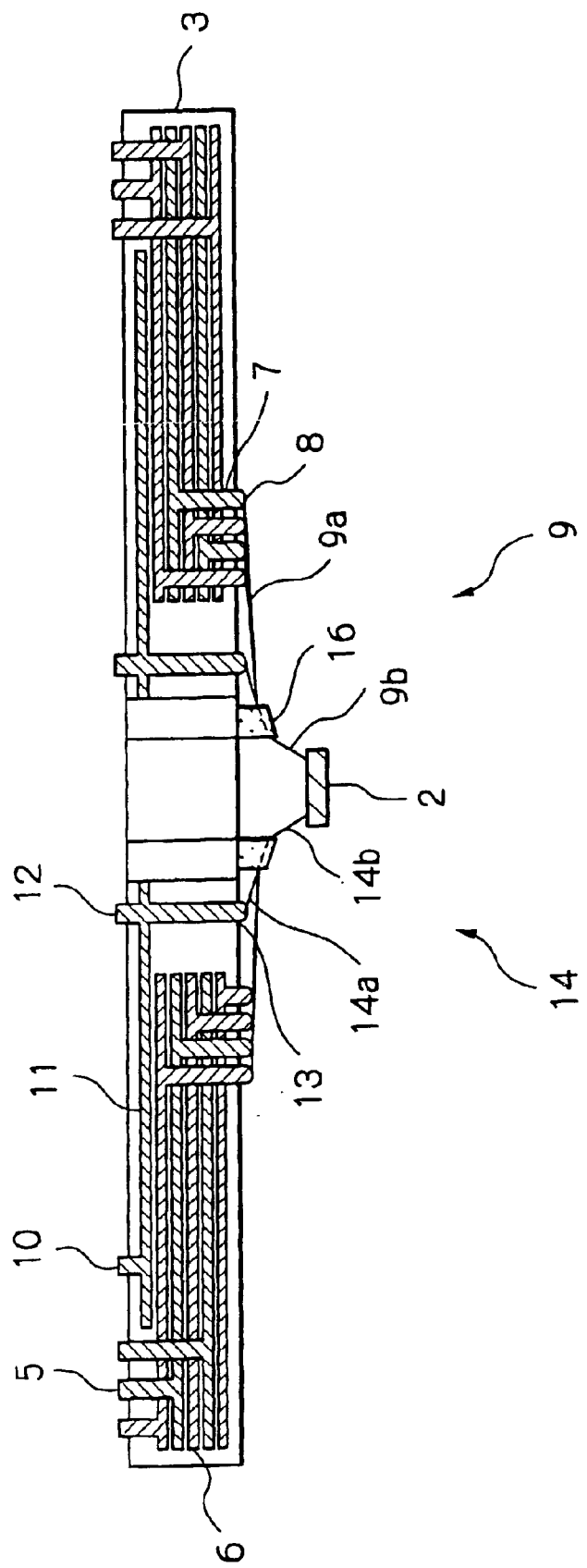
FIG. 2 shows a schematic, enlarged section along line II—II shown in FIG. 1.
Figure 3:
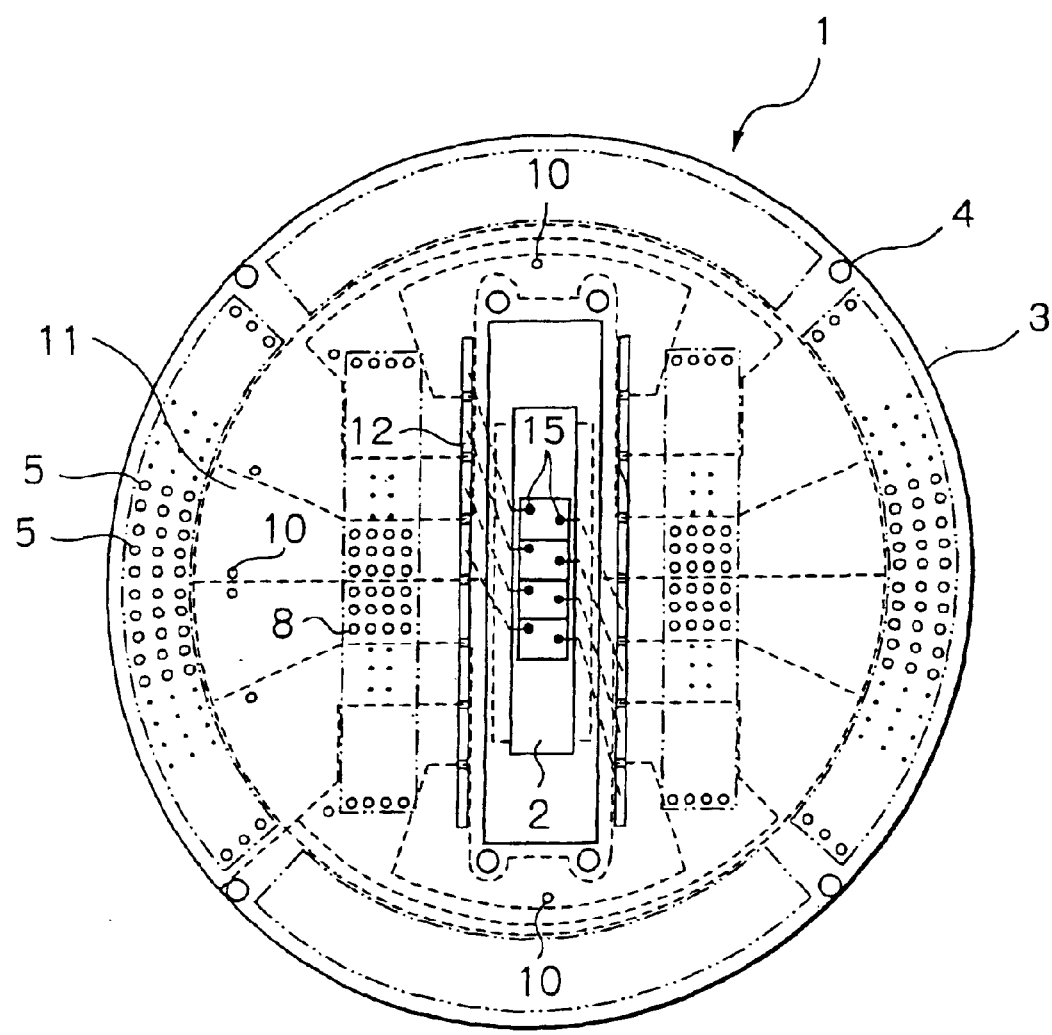
FIG. 3 is a schematic front view, like FIG. 1, showing another conventional substrate for a probe card.
Figure 4:
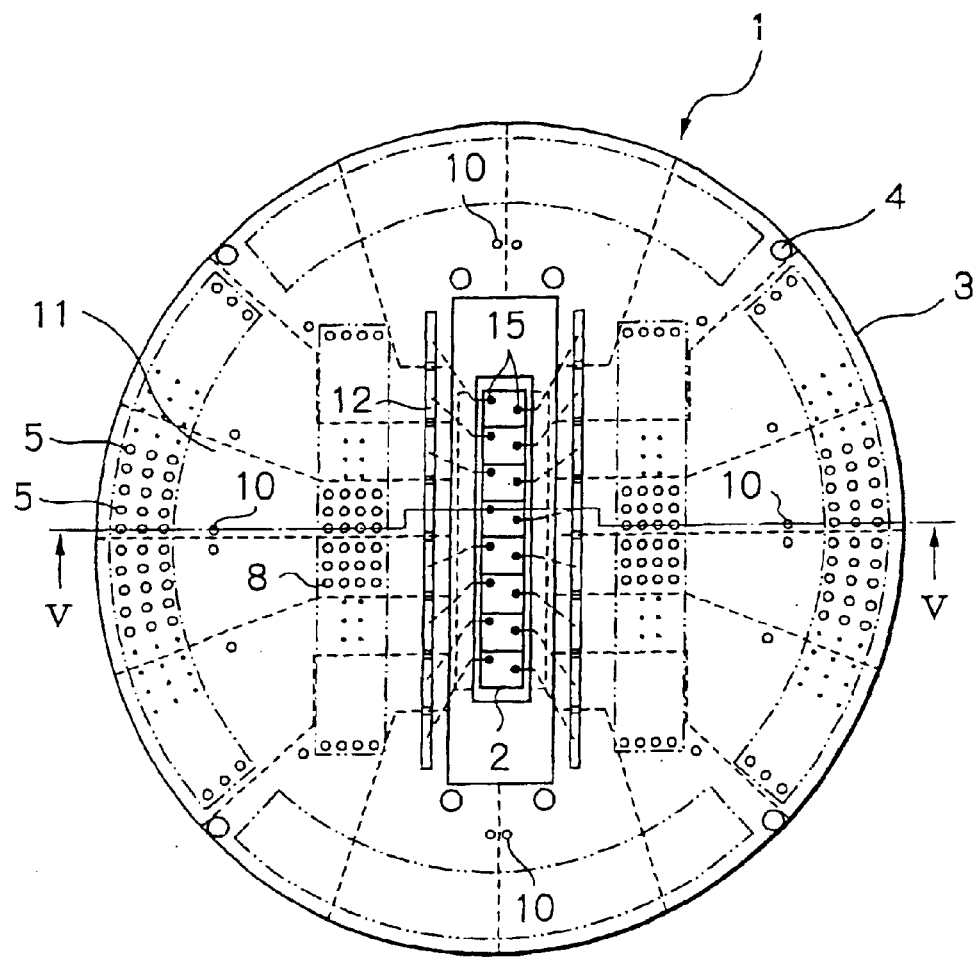
FIG. 4 is a schematic front view, like FIG. 1, showing still another conventional substrate for a probe card.
Figure 5:
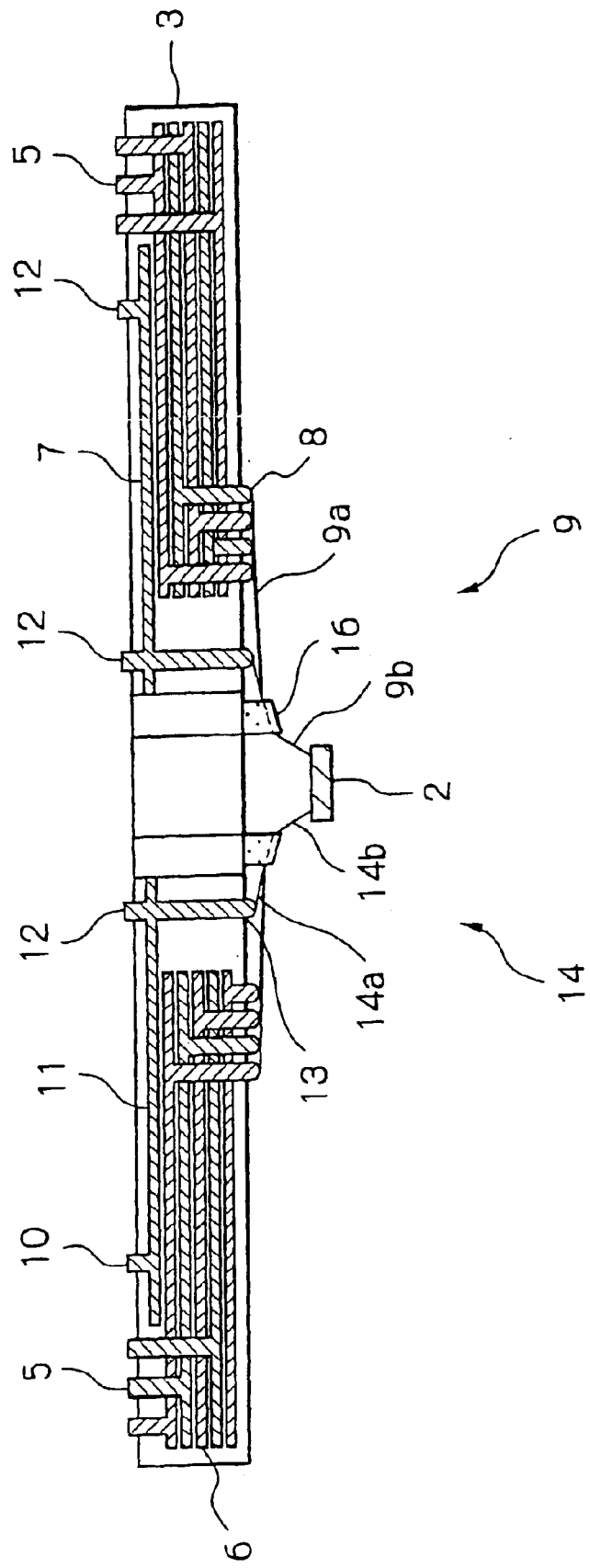
FIG. 5 shows a schematic, enlarged section, like FIG. 2, along line V—V shown in FIG. 4.
Figure 6:
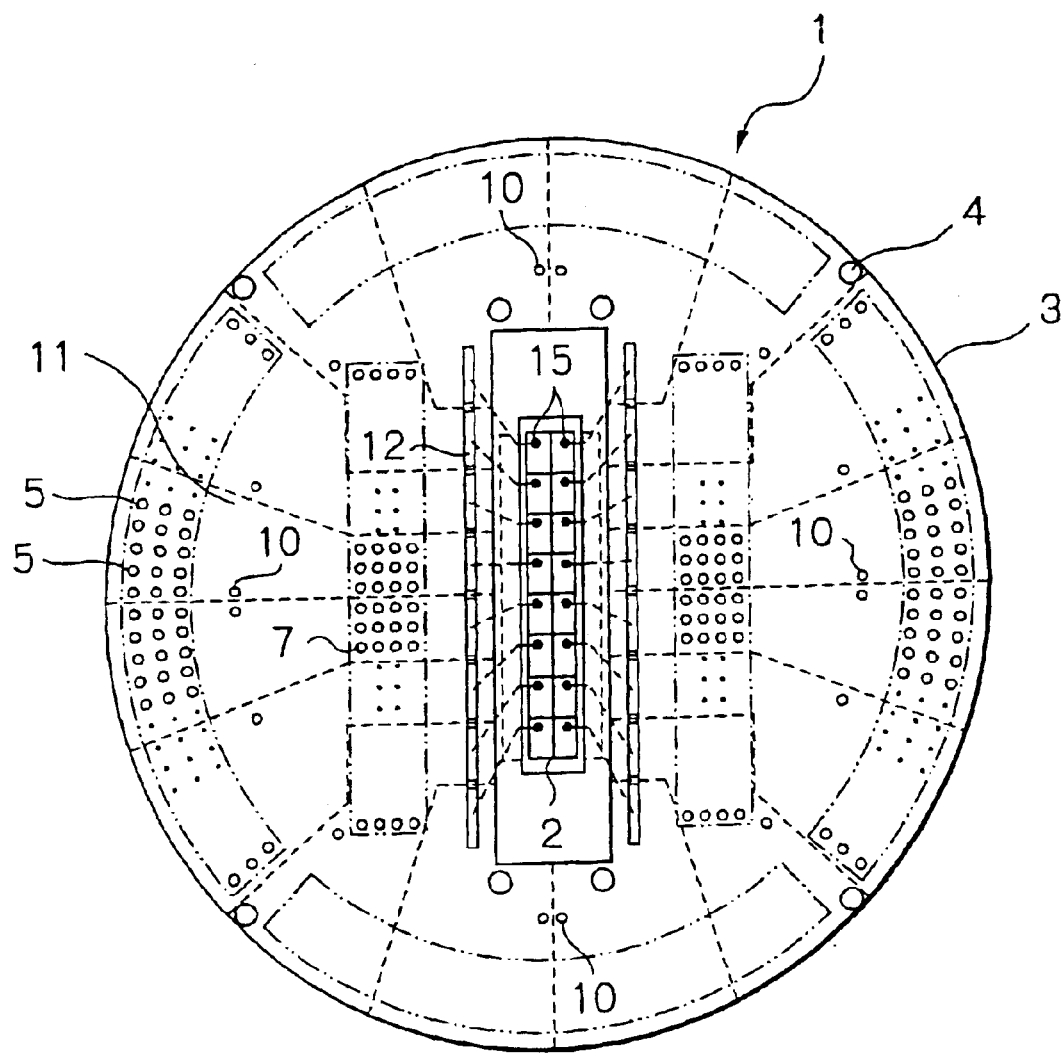
FIG. 6 is a schematic front view, like FIG. 1, showing a modification of the configuration of FIGS. 4 and 5.
Figure 7:
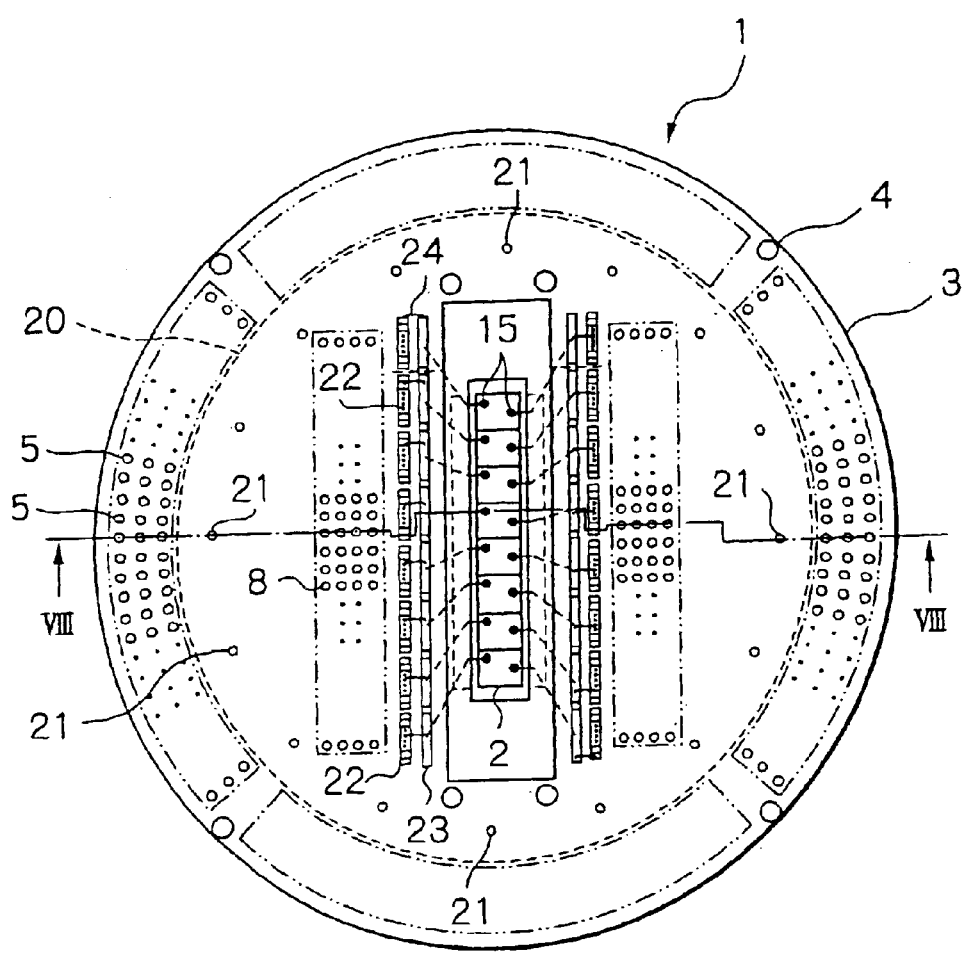
FIG. 7 is a schematic front view showing an embodiment of a substrate for a probe card in accordance with the present invention.
Figure 8:
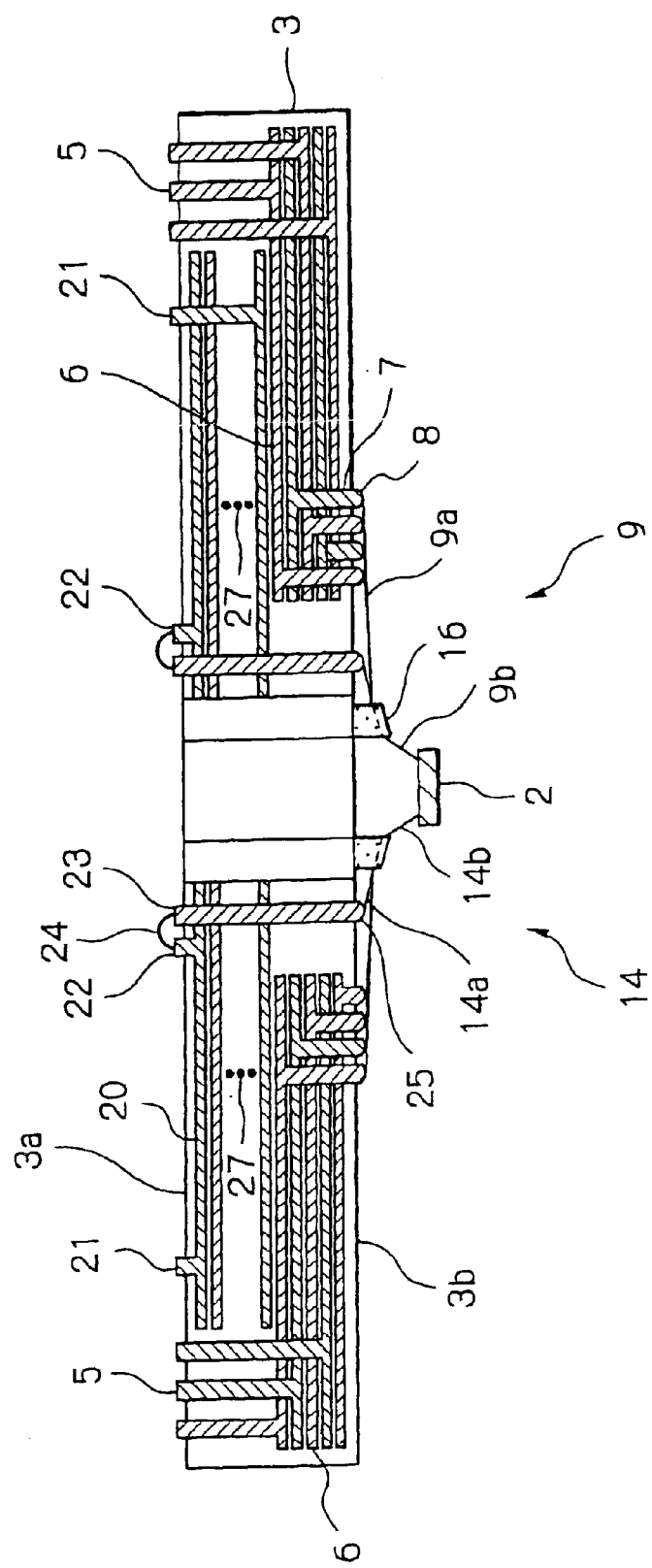
FIG. 8 shows a schematic, enlarged section along line VIII—VIII shown in FIG. 7.

Referring now to FIGS. 7 and 8, an embodiment of a substrate for a probe card in accordance with the present invention will be described. Structural elements like those shown in FIGS. 1 through 6 are designated by identical reference numerals and will not be described specifically in order to avoid redundancy. As shown, the probe card, generally denoted with a reference numeral 1, includes a stack of flat conductive plates 20 which are stacked with respect to a direction substantially perpendicular to the primary, or top and bottom, surfaces thereof. Each conductive plate 20 has its top and bottom surfaces electrically insulated, constituting a power supply layer. The flat configuration of the conductive plate 20 successfully reduces resistance in supplying the electric power and therefore enhances a response time in testing IC devices 2. The substrate 3 includes a stack of signal layers 6, which are also stacked with respect to a direction substantially perpendicular to the primary, or top and bottom, surfaces thereof and also to the primary surfaces of the power supply plates 20. Each of the power supply plates 20 has a particular pattern of electrically conductive material formed thereon as described with reference to FIGS. 1 and 2.

While the number of conductive plates or power supply layers 20 is open to choice, it should preferably be equal to or greater than the number of semiconductor IC devices 2 to be tested in one lot, i.e. at the same time. In the illustrative embodiment, sixteen conductive plates 20 are stacked to test the layers 20 are depicted for simplicity with the remainders omitted by simply being represented with dots 27. Each conductive plate 20 is provided with a single tester power supply terminal 21 in the form of stem, preferably of a cylindrical shape. The tester power supply terminal 21 is supported or affixed on the top surface of the conductive plate 20 to extend over a length beyond the level of the upper surface 3a of the substrate 3 in the direction substantially perpendicular to the top surface of the plate 20. To the terminal 21, applied is a power supply voltage from a tester head, not shown. It follows that the probe card 1 has sixteen tester power supply terminals 21 in total, in the embodiment.

To manufacture each of the conductive plate 20, a flat, thin conductor plate may be pressed or otherwise formed and then adhered to a plate made of an electrical insulator. One conductor plate 20 is formed in such a fashion that, for example, the portions of the thin conductor plate are removed which are expected to insulatively receive the tester power supply terminals 21, groups of power supply terminals 22 and float terminals 23 of the other plates 20, thereby electrically isolating those terminals from the conductive plate 20. Alternatively, the conductive plate 20 may be implemented by a resin plate or similar insulative plate processed in the same manner as with a printed circuit board. The power supply terminals 22 are in the form of stems, preferably of a cylindrical shape, supported on the top surface of the power supply layers 20 to extend over a length beyond the level of the upper surface 3a of the substrate 3 in the direction substantially perpendicular to the top surface of the plate 20. The float terminals 23 are also in the form of stems, preferably of a cylindrical shape, in the illustrative embodiment. The float terminal 23 extends over a length between the levels of the upper and lower surfaces 3a and 3b of the substrate 3 in the direction substantially perpendicular to the primary surface of the power supply layers 20.

The power supply terminals 22 correspond in number to the power supply layers 20 (sixteen in the illustrative embodiment) and are insulated from each other. The power supply terminals 22 are positioned in the vicinity of the IC devices 2. Each of the power supply terminals 22 is connected to a particular conductive plate 20 and therefore to a particular tester power supply terminal 21. In the illustrative embodiment, the power supply terminals 22 are arranged in two arrays at both sides of the IC devices 2 in its plan view. The power supply terminals 22 of the two arrays facing each other are connected to the same conductive plate 20, as illustrated.

It should be noted that the power supply terminals 22 may be arranged at any desired positions close to the testing portion of the probe card 1. It should also be noted that the number of the power supply terminals 22 is not limited to the integral multiple of the number of the IC devices 2 to be tested together.

The float terminals 23 each adjoin a particular power supply terminal 22 and extend throughout the substrate, labeled 3, FIGS. 7 and 8. The float terminals 23 per se are insulated from all of the conductive plates 20 except jumper wires 24. Each of the jumper wires 24 connects one of the power supply terminals 22 to one of the float terminals 23 that adjoin each other, thereby conveying a power supply voltage from the former to the latter. Probe needles 14 each are soldered or otherwise affixed to a needle seat portion 25 and connected to the associated float terminal 23 thereby.

Figure 9:
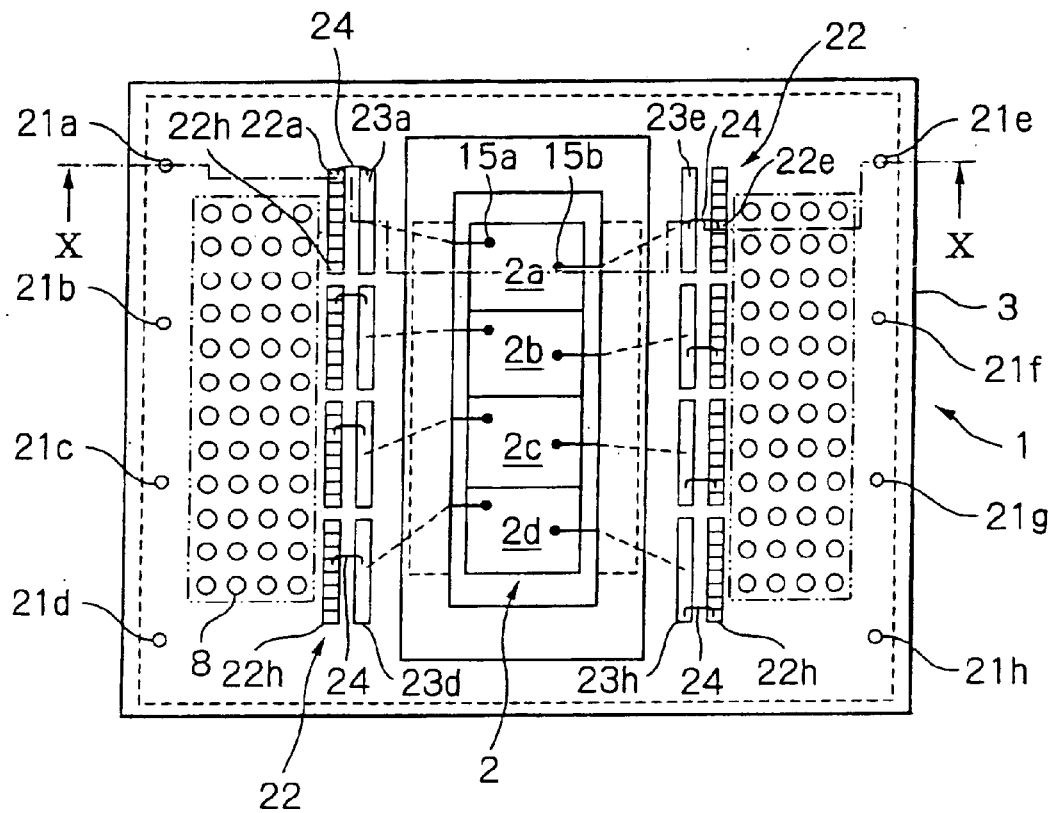
FIG. 9 is a schematic fragmentary front view showing a simplified configuration of the illustrative embodiment.
Figure 10:
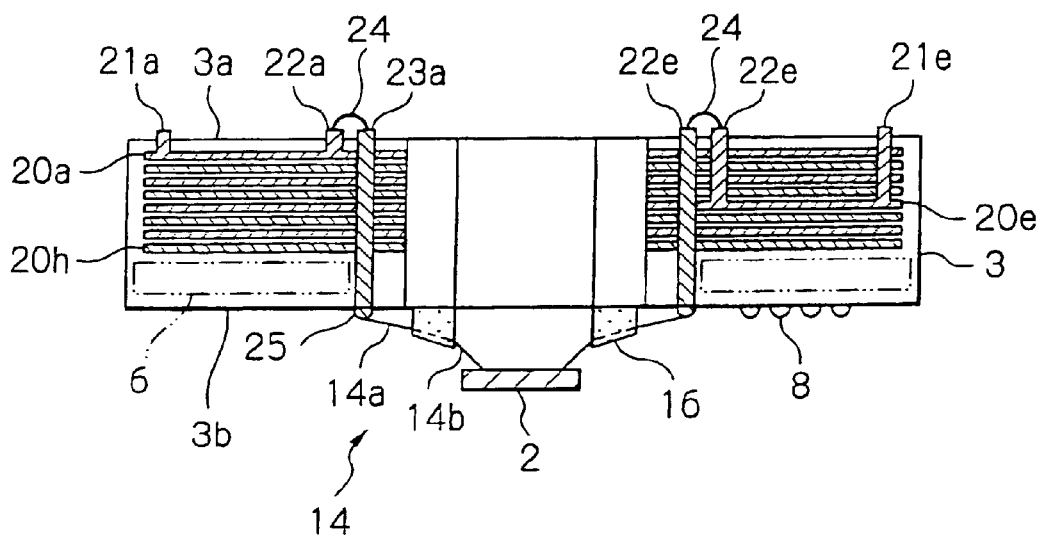
FIG. 10 shows a schematic section along line X—X shown in FIG. 9.

Reference will be to FIGS. 9 and 10 for describing the operation of the probe card 1 of the illustrative embodiment. In FIG. 9, for the sake of simplicity of description, the probe card 1 is assumed to include eight power supply layers for testing only four IC devices 2a, 2b, 2c and 2d collectively. In FIGS. 9 and 10, which correspond to FIGS. 7 and 8, respectively, structural elements like those shown in FIGS. 7 and 8 are designated by identical reference numerals. FIG. 9, as well as FIG. 7, mainly shows a wiring pattern applicable to semiconductor IC devices of the kind supplied with two different power supply voltages. In the following, suffixes "a" "b" "c" and "d", and "e" "f" "g" and "h" are associated with IC devices 2a, 2b, 2c and 2d, respectively. For simplicity, not all the components are denoted in the figures with the reference numerals with those suffixes, but may be described. In addition, the signal layers 6 are collectively denoted with boxes of chain-and-dot line with associated circuits thereof omitted from illustration.

As shown in FIGS. 9 and 10, the probe card 1 includes a group of tester power supply terminals 21a, 21b, 21c and 21d and another group of tester power supply terminals 21e, 21f, 21g and 21h. In the illustrative application, the tester head feeds a first power supply voltage to the tester power supply terminals 21a through 21d and a second power supply voltage, different from the first voltage, to the tester power supply terminals 21e through 21h. The specific, illustrative application includes eight groups of power supply terminals 22, each of which includes the eight power supply terminals 22a through 22h.

The tester power supply terminal 21a is connected to the power supply terminal 22a of each of the power supply terminal groups 22 via a conductive plate or power supply layer 20a, delivering the first power supply voltage to the terminal 22a. Likewise, the tester power supply terminal 21e is connected to the power supply terminal 22e of each power supply terminal group 22 via a conductive plate 20e, thus applying the second power supply voltage to the terminal 22e. The remaining tester power supply terminals are configured in the same manner as the power supply terminals 22a and 22e.

To feed the first power supply voltage to the IC device 2a, the jumper wire 24 connects a float terminal 23a to the power supply terminal 22a. In this condition, the first power supply voltage is delivered from the power supply terminal 22a to a power supply pad 15a, which is formed on the IC device 2a, through the jumper wire 24, the float terminal 23a, and a probe needle 14. Likewise, another jumper wire 24 connects a float terminal 23e to the power supply terminal 22e. In this condition, the second power supply voltage is applied to a power supply pad 15b also formed on the IC device 2a via the jumper wire 24, the float terminal 23e, and another probe needles 14. The remaining IC devices 2b, 2c and 2d each are connected to receive the first and second power supply voltages in the same manner as the IC device 2a.

The respective IC devices 2a through 2d have pads for signals, not shown, additionally formed thereon. Signals are fed from tester terminals for signals to those pads via a conductive pattern formed on a signal layer, needle seal portions and probe needles 9, although not shown specifically. A response to the signals, for example, is measured by the tester in order to determine whether or not the IC devices 2a through 2d are acceptable. In this manner, the four IC devices 2a through 2d each supplied with two different kinds of power supply voltages are tested simultaneously.

In an application where a single power supply voltage should be applied to the power supply pads 15a and 15b of the IC-device 2a, the power supply terminals 22a connected to the same conductive plate 20a are connected to the respective float terminals 23a and 23e by jumper wires 24. In this condition, the power supply voltage is fed to the IC device 2a in the above-described manner. More specifically, the power supply voltage of the same potential is applied to the power supply terminals 22a connected to the same conductive plate 20a. This makes it needless to manufacture a new, exclusive substrate and therefore quickly adapts to a change in the specifications of the IC devices.

Further, when a single power supply voltage is to be applied to one of the two power supply pads of the individual IC device, either the right or left part of the substrate 3, as viewed in FIG. 9, suffices. Therefore, even when eight IC devices are arranged in two arrays, they can be tested at a time if the power supply voltage is applied to the IC devices from both of the right and left parts of the substrate 3.

Moreover, the configurations described above may be suitably combined so as to allow the substrate 3 to adapt even to a single wafer which has different kinds of IC devices formed thereon.

Figure 11:
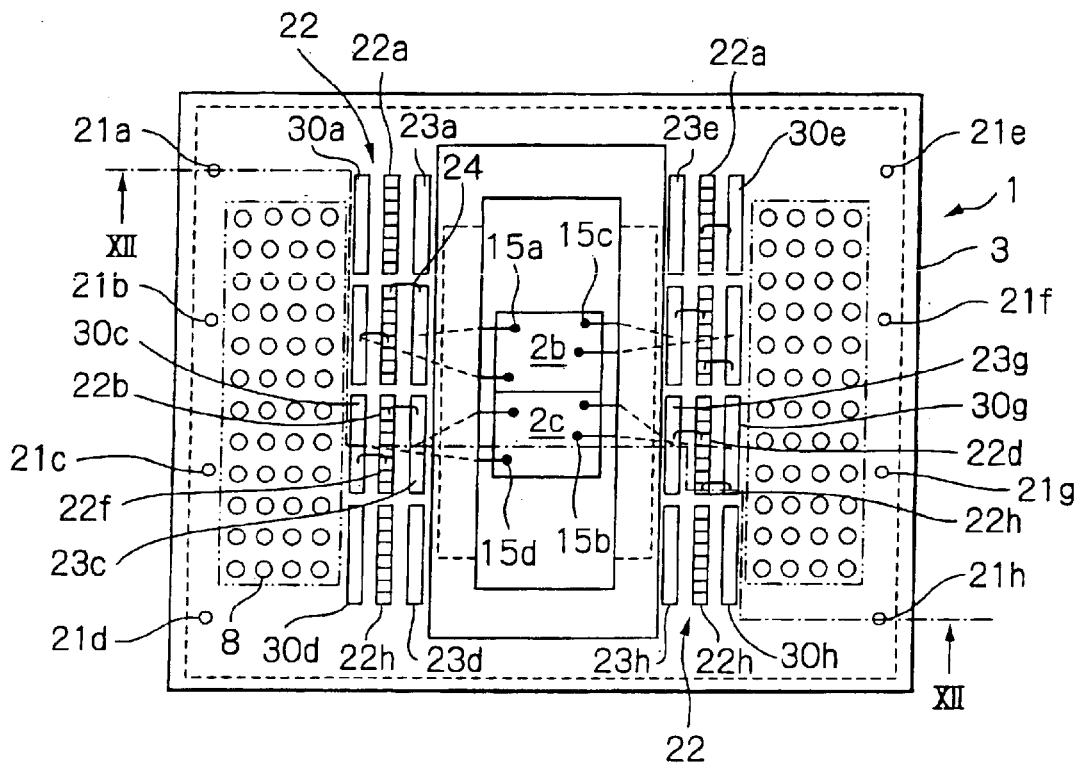
FIG. 11 is a schematic front view, like FIG. 9, showing an alternative embodiment of the present invention.
Figure 12:
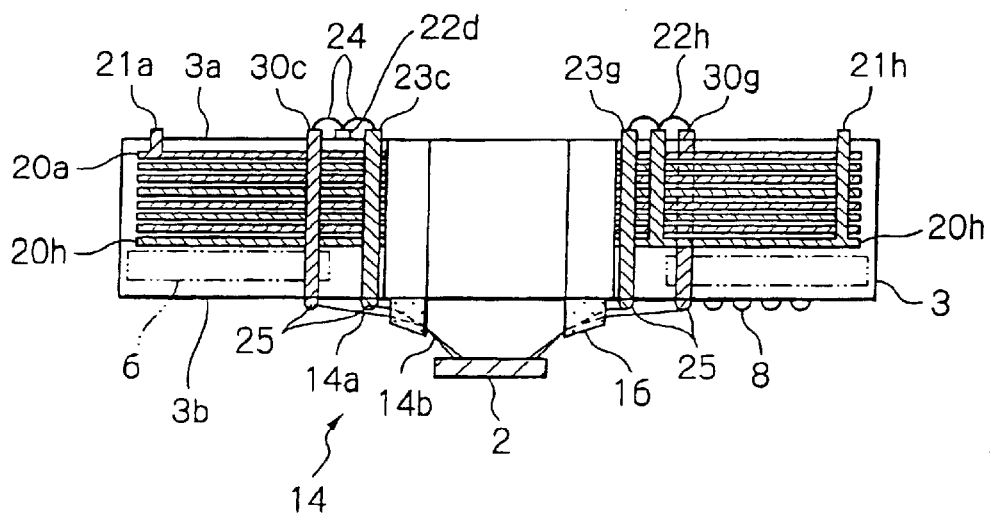
FIG. 12 schematically shows a section, like FIG. 10, along line XII—XII shown in FIG. 11.

Reference will be made to FIGS. 11 and 12 for describing an alternative embodiment of the present invention. Structural elements like those of the previously described embodiment are designated by identical reference numerals and will not be described specifically in order to avoid redundancy. As shown, the illustrative embodiment additionally includes float terminals 30a through 30h. The additional float terminals 30a through 30h are identical in configuration with the float terminals 23a through 23h, and each adjoin a particular group of power supply terminals 22.

The operation of the illustrative embodiment will be described hereinafter on a specific application in which two semiconductor IC devices 2b and 2c each include four power supply pads 15a through 15d to be supplied with four different power supply voltages. Because the illustrative embodiment has eight power supply layers like the previously described embodiment, it can simultaneously test only two IC devices fed with the four different power supply voltages each.

Specifically, a first power supply voltage is applied to the power supply terminals 21a and 21b while a second power supply terminal is applied to the power supply terminals 21c and 21d. Likewise, a third and a fourth power supply voltage are applied to the power supply terminals 21e and 21f and power supply terminals 21g and 21h, respectively. The first to fourth power supply voltages are respectively delivered from the power supply terminals 21a through 21h to the power supply terminals 22a through 22h via the associated conductive plates 20a through 20h.

The float terminals 23c, 23g, 30c and 30g that are closer to the IC device 2c, are, for example, connected by jumper wires 24 to the power supply terminals 22b, 22d, 22f and 22h, respectively, as illustrated. In this condition, the first power supply voltage is fed from the power supply terminal 22b to the float terminal 23c. Likewise, the second power supply voltage is fed from the power supply terminal 22d to the float terminal 23g. The third power supply voltage is fed from the power supply terminal 22f to the float terminal 30c. Further, the fourth power supply voltage is applied from the power supply terminal 22h to the float terminal 30g. The probe needles 14 each having the respective contact portion 14b are positioned at the needle seat portions 25 of the float terminals 23c and 30c. The contact portions 14b respectively contact the power supply pads 15a through 15d of the IC device 2c at their tips, thereby feeding the first through fourth power supply voltages to the IC device 2c.

Subsequently, a test signal is fed from signal terminals, not shown, to the IC devices 2b and 2c in order to measure, e.g., response time, thereby determining whether or not the IC devices 2b and 2c are acceptable.

It is to be noted that the connection of the power supply terminals and float terminals shown and described is only illustrative. The crux is that necessary power supply voltages be fed to the float terminals closer to the power supply pads 15a through 15d in accordance with the arrangement of the pads 15a through 15d.

As stated above, the illustrative embodiment can cope with many different power supply voltages by feeding the voltages to the power supply pads of IC devices from float terminals, which are closer to the IC devices, via short probe needles. This promotes accurate decision on the acceptability of the IC devices. Furthermore, a single substrate adapts itself to several different power supply voltages and therefore further promotes general-purpose application. This is particularly true with applications requiring many different power supply voltages.

Figure 13:
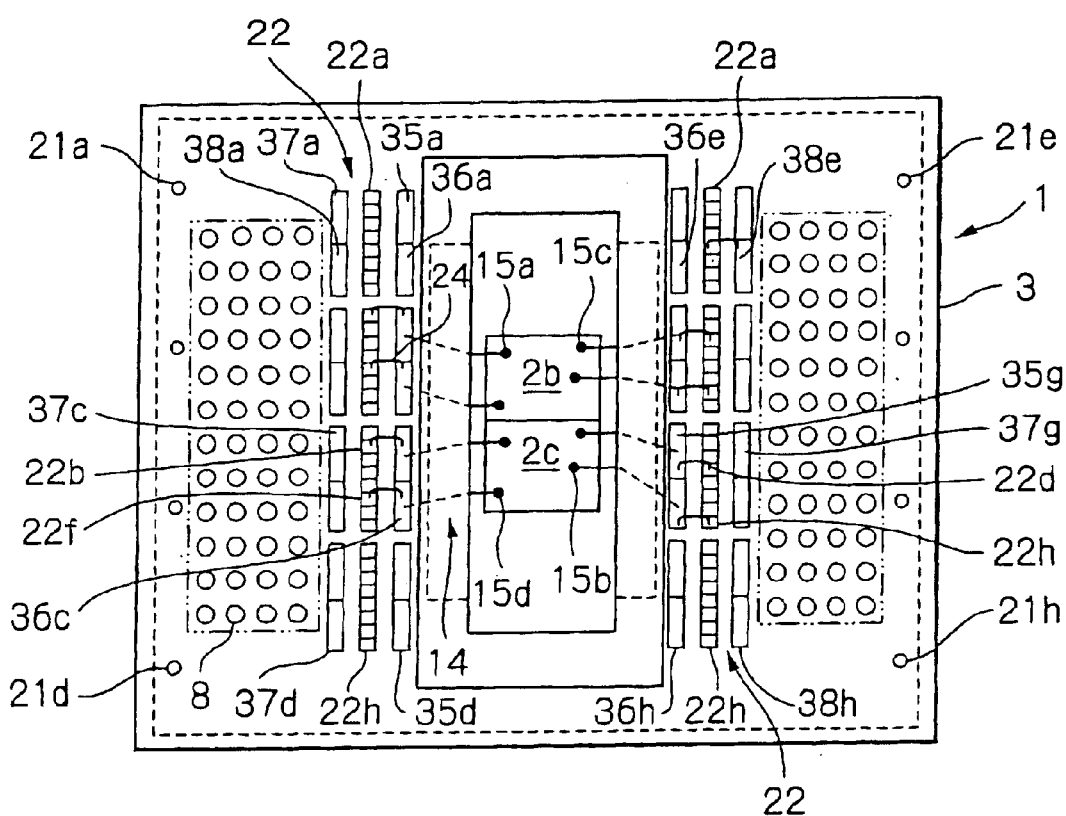
FIG. 13 is a schematic front view, like FIG. 9, showing a modification of the embodiment of FIGS. 11 and 12.

FIG. 13 shows a modification of the illustrative embodiment. As shown, the modification is the same as the illustrative embodiment shown in FIGS. 11 and 12 except that the float terminal 23a shown in FIG. 11 is divided into a couple of float subterminals 35a and 36a, and the float terminals 23b shown in FIG. 11 is divided into another couple of float subterminals 36b and 36b, and so on, as well as that the float terminal 30a is also divided into a further couple of float subterminals 37a and 38a, and the float terminals 30b is divided into still another couple of float subterminals 37b and 38b, and so on. The float subterminals 35a and 36a are electrically insulated from each other, and the float subterminals 37a and 38a are also insulated from each other. The remaining float subterminals 35b through 35h, 36b through 36h, 37b through 37h and 38b through 38h are insulated in the same fashion. This configuration allows the probe needle 14 expected to contact, e.g., the power supply pad 15d of the IC device 2c to extend from the float subterminal 36c. It is therefore possible to reduce the length of the probe needle 14 and to readily adapt to even more kinds of power supply voltages than the configuration shown in FIG. 11.

As stated above, the modification reduces the length of the probe needles 14 and thereby further enhances accurate decision on acceptability. Moreover, the modification can cope with more kinds of power supply voltages and thereby further enhances the general-purpose applicability of the substrate. It is to be noted that the float terminals can be divided into any desired number of segments and can be arranged in any desired number of arrays. More specifically, the numbers of segments and arrays may be increased when a general-purpose substrate is designed, further promoting adaptability to various kinds of semiconductor IC devices.

In the illustrative embodiment and modification therefrom, the more the semiconductor IC devices to be tested together, the fewer the kinds of power supply voltages required. Alternatively, the substrate 3 may, of course, be adapted so as to increase the kinds of power supply layers included in the substrate for the purpose described above without decreasing the number of IC devices to be tested in one lot.

Figure 14:
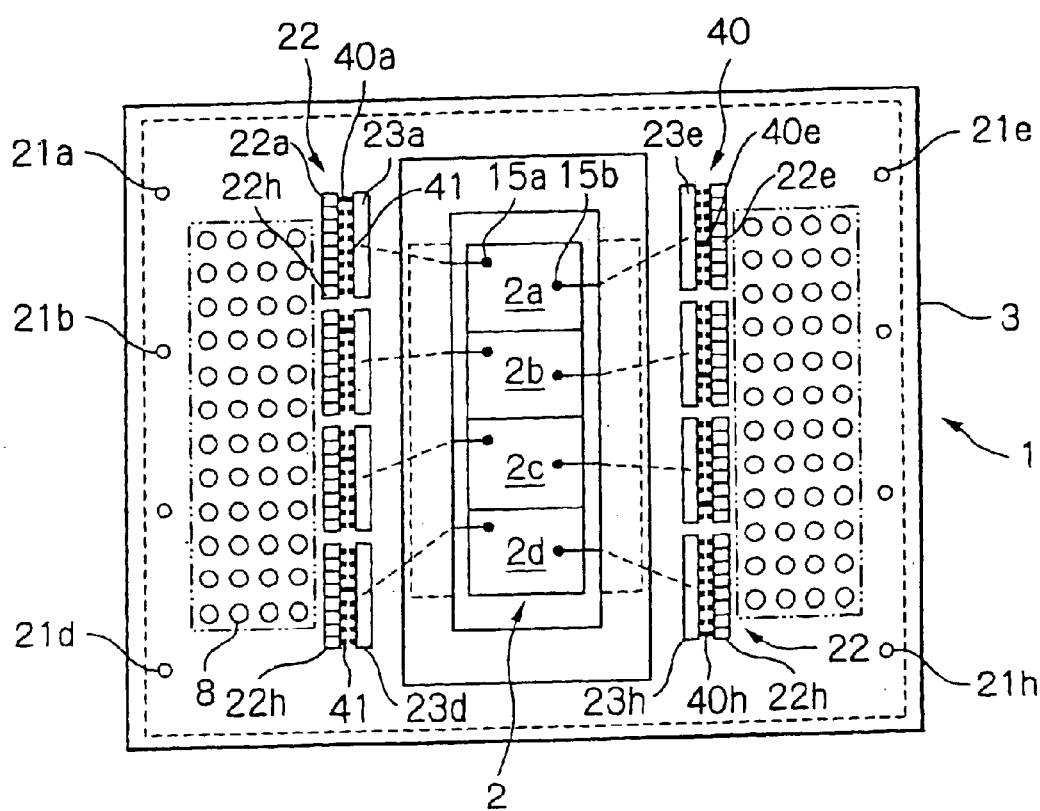
FIG. 14 is a schematic front view, like FIG. 9, showing another alternative embodiment of the present invention.

Another alternative embodiment of the present invention will be described with reference to FIG. 14. Structural elements like those shown in FIG. 9 are designated by identical reference numerals and will not be described specifically in order to avoid redundancy. As shown, the illustrative embodiment includes conductive patterns, generally 40, made up of patterns of electrically conductive material 40a through 40h. Each of the conductive patterns 40a through 40h serves as jumper wiring to connect desired one of the power supply terminals 22a through 22h of one of the power supply terminal groups 22 to one of the float terminals 23a through 23h adjoining the one power supply terminal group. Slits 41 are appropriately formed by cutting part of the conductive patterns 40 off with a knife, chisel or similar edge tool, for example.

The operation of the illustrative embodiment will be described hereinafter in an application in which two different power supply voltages are required as in the operation described with reference to FIGS. 9 and 10 and also the first and second power supply voltages are applied to the same tester power supply terminals as in FIGS. 9 and 10.

To feed the first power supply voltage from the tester power supply terminal 21a, the slits 41 are formed in the conductive patterns 40b through 40h for thereby interrupting conduction. The conduction of the conductive pattern 40a is maintained, which connects the power supply terminal 22a connected to the tester power supply terminal 21a to the float terminal 23a. The power supply voltage is fed from the power supply terminal 22a to the float terminal 23a.

Likewise, to feed the second power supply voltage from the tester power supply terminal 21e, the slits are formed in the conductive patterns 40a through 40d and 40f through 40h for thereby interrupting conduction. The conduction of the conductive pattern 40e is maintained. In this condition, the power supply voltage is fed from the power supply terminal 22e to the float terminal 23e. The first and second power supply voltages are fed to the power supply pads 15a and 15b of the device 2a, respectively. The power supply voltages are fed to the remaining power supply pads 15a and 15b of the devices 2b, 2c and 2d in the same manner. The decision on the acceptability of the IC devices 2a through 2d is effected in one lot in the same manner as in the operation described with reference to FIGS. 9 and 10.

As stated above, the illustrative embodiment connects the power supply terminals and float terminals with the conductive patterns in place of the jumper wires. Slits are then formed in needless ones of the conductive patterns, so that only a necessary power supply terminal and a necessary float terminal are held in conduction. The illustrative embodiment therefore promotes easy, efficient work while further enhancing immediate adaptation. The illustrative embodiment is also similarly applicable to the embodiment shown in FIGS. 11 and 12.

Figure 15:
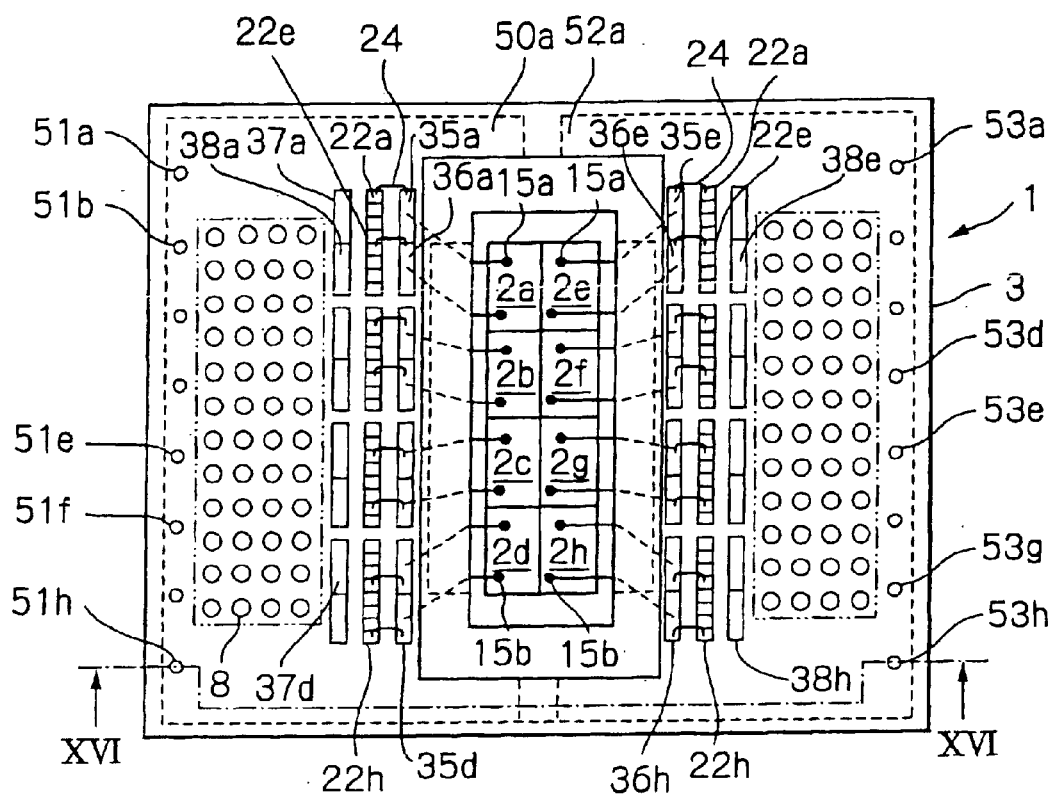
FIG. 15 is a schematic front view, like FIG. 9, showing a further alternative embodiment of the present invention.
Figure 16:
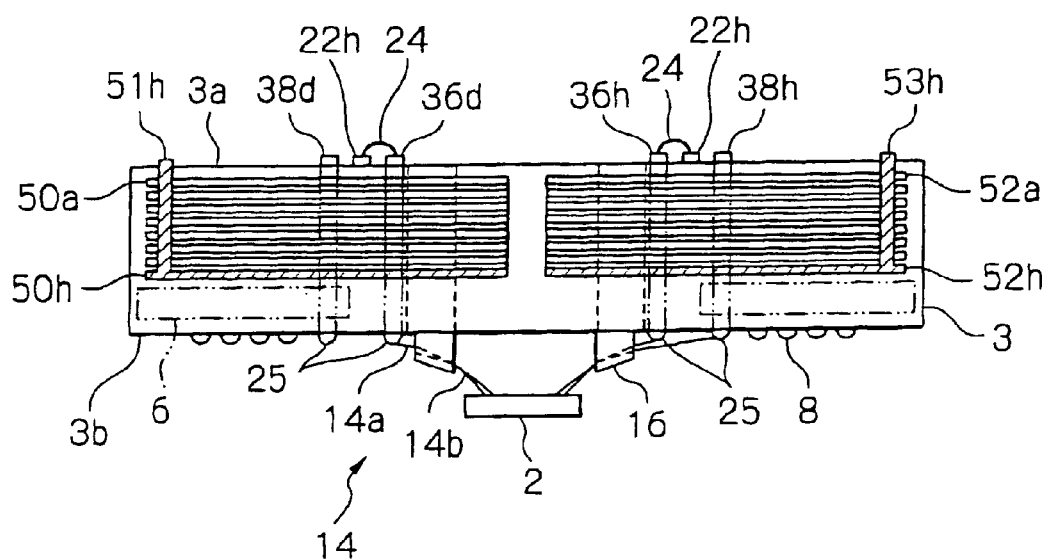
FIG. 16 schematically shows a section, like FIG. 10, along line XVI—XVI shown in FIG. 15.

Referring to FIGS. 15 and 16, a further alternative embodiment of the present invention will be described that is similar to the modification shown in FIG. 13 except for the following. Structural elements like those shown in FIGS. 9, 10 and 13 are designated by identical reference numerals and will not be described specifically in order to avoid redundancy. As shown, the illustrative embodiment includes two stacks of conductive plates or layers 50a through 50h and 52a through 52h which are resultant from bisecting the conductive plates 20.

Tester power supply terminals 51a through 51h and power supply terminals 53a through 53h feed power supply voltages to the conductive plates 50a through 50h and 52a through 52h, respectively. More specifically, each of the conductive plates 50a through 50h and 52a through 52h are connected to a particular tester power supply terminal and a particular power supply terminal, respectively. The conductive plate 50h, for example, is connected to a tester power supply terminal 51h as shown and ultimately to a power supply terminal 22h. The conductive plate 52h is connected to a tester power supply terminal 53h as shown and ultimately to a power supply terminal 22h.

In FIG. 15, there is shown an application in which eight semiconductor IC devices 2a through 2h are arranged in two arrays and tested simultaneously. Suffixes "a" through "h" are associated with IC devices 2a through 2h, respectively, although not all shown in the figures. As for the IC device 2a, for example, the first power supply voltage is applied to the power supply terminal 22a via the conductive plate 50a, which is connected to the tester power supply terminal 51a. In this case, the jumper wire 24 connects the power supply terminal 22a to the float subterminal 35a. The tip of the contact portion 14b of the probe needle 14 positioned at the needle seat portion 25 is brought into contact with the power supply pad 15a. The first power supply voltage is thus fed to the IC device 2a via the power supply pad 15a.

Likewise, the second power supply voltage input to the tester power supply terminal 51e is delivered to the IC device 2a via the jumper wire 24, which connects the power supply terminal 22e to the float subterminal 36a, and to the power supply pad 15b of the device 2a. The jumper wires 24 may be replaced with the conductive patterns as shown in FIG. 14, if desired.

As for the IC device 2e, the first power supply voltage is applied to the power supply terminal 22a through the conductive plate 52a connected to the tester power supply terminal 53a. The jumper wire 24 connects the power supply terminal 22a to the float subterminal 35e. The contact portion 14b of the probe needle 14 positioned at the needle seat portion 25 is then brought into contact with the power supply pad 15a. As a result, the first power supply voltage is input to the IC device 2e via the power supply pad 15a. Likewise, the second power supply voltage input to the tester power supply terminal 53e is fed to the power supply pad 15b of the IC device 2e via the power supply terminal 22, jumper wire 24, and float subterminal 36e.

The first and second power supply voltages are also fed to the power supply pads 15a and 15b of the other IC devices 2b through 2d and 2f through 2h, respectively, via the corresponding conductive plates 50 and 52.

As stated above, the illustrative embodiment is capable of efficiently testing a plurality of devices each needing two different power supply voltages in a lump. This is particularly desirable when a number of IC devices each needing a relatively small number or kind of power supply voltages should be tested together. When those IC devices need only a single power supply voltage, the number of conductive layers can be reduced. Further, by applying the configuration shown in FIGS. 9 and 10, it is possible to simplify the configuration of the substrate 3 and therefore to reduce the production cost.

The embodiments shown and described may be suitably combined together. In any case, there can be implemented a general-purpose substrate adaptive to various kinds of testing conditions only modifying the wiring of jumper wires or the cutting of conductive patterns and the positions of the probe needles. Therefore, a number of substrates for probe cards each including a necessary number of power supply layers can be produced in a quantity basis in consideration of the actual circumstances of a test line or the kinds of future IC devices to be tested. This successfully reduces the production cost of the substrates. Moreover, the embodiments shown and described contribute to the construction of a testing system having immediate adaptability.

In summary, in accordance with the present invention, a substrate for a probe card includes two or more power supply layers. A power supply terminal group is formed by power supply terminals which are connected to a conductive plate provided on the respective power supply layers and identical in number with the power supply layers. Jumper wires each connect a particular float terminal, which adjoins the power supply terminal group, to a particular power supply terminal. In this configuration, even when a plurality of power supply voltages are necessary for semiconductor devices to be tested, shorter probe needles can connect the float terminal to the power supply pads of one of the semiconductor IC devices which is closer to the float terminal. This accomplishes the lower resistance of the probe needles to thereby reduce noise in testing. The substrate is therefore free from decision errors ascribable to delay in response time and noise, insuring accurate decisions and enhancing the productivity of semiconductor IC devices.

Further, only if the probe needles, for example, are adaptively rearranged, the substrate can adapt to various kinds of tests, e.g., testing a greater number of IC devices in a lump by applying a single power supply voltage to a single power supply pad, and testing different kinds of IC devices formed on a single wafer in a lump. This promotes the general-purpose application of the substrate, lowers the test cost, and implements a testing system having immediate adaptability.

The entire disclosure of Japanese patent application No. 2001-296669 filed on Sep. 27, 2001, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A substrate for a probe card for use in testing a plurality of semiconductor IC (Integrated Circuit) devices in a lump, comprising:

a stack of power supply layers of electrically conductive material;

a stack of signal layers of electrically conductive material for conveying electric signals for testing the plurality of IC devices to and from a tester;

said stack of power supply layers and said stack of signal layers being stacked in a direction substantially perpendicular to said stack of power supply layers and said stack of signal layers;

a first plurality of power supply terminals provided in a form of stems each supported on one of said power supply layers for receiving a power supply voltage output from the tester; and a second plurality of power supply terminals in a form of stems each supported on one of said power supply layers to be connected to the plurality of IC devices to be tested;

each of said first plurality of power supply terminals being connected to one of said second plurality of power supply terminals by one of said power supply layers;

each of said power supply layers having openings formed for insulatively receiving the stems supported on remaining ones of said power supply layers.

2. A substrate for a probe card for use in testing a plurality of semiconductor IC (Integrated Circuit) devices in a lump, comprising:

a first plurality of power supply terminals for receiving a power supply voltage output from a tester;

a second plurality of power supply terminals to be connected to the plurality of IC devices to be tested;

a plurality of power supply layers each connecting one of said first plurality of power supply terminals to one of said second plurality of power supply terminals; and a plurality of signal layers for conveying electric signals for testing the plurality of IC devices to and from the tester.

3. The substrate in accordance with claim 2, wherein said plurality of power supply layers and said plurality of signal layers are stacked in a direction substantially perpendicular to said plurality of power supply layers and said plurality of signal layers.

4. The substrate in accordance with claim 3, wherein said first plurality of power supply terminals are in a form of stems each supported on one of said plurality of power supply layers, said second plurality of power supply terminals being in a form of stems each supported on one of said plurality of power supply layers, each of said plurality of power supply layers having openings formed for insulatively receiving the stems supported on remaining ones of said plurality of power supply layers.

5. The substrate in accordance with claim 4, wherein said second plurality of power supply terminals form a power supply terminal group, each of said power supply layers being connected to one of said second plurality of power supply terminals of said power supply terminal group.

6. The substrate in accordance with claim 5, further comprising:

a plurality of float terminals provided in a form of stems each supported on one of said plurality of power supply layers to adjoin said power supply terminal group;

a plurality of connections each for connecting one of said plurality of float terminals to any one of said second plurality of power supply terminals; and a plurality of probe needles each connected to one of said float terminals and contacting a power supply pad formed on the IC devices.

7. The substrate in accordance with claim 6, wherein each of said plurality of float terminals comprises a plurality of float subterminals assigned to said power supply terminal group.

8. The substrate in accordance with claim 6, wherein said plurality of connections are in a form of wires each for connecting one of said plurality of float terminals to any one of said second plurality of power supply terminals.

9. The substrate in accordance with claim 6, wherein said plurality of connections are in a form of patterns of conductive material each for connecting one of said plurality of float terminals to any one of said second plurality of power supply terminals.

10. The substrate in accordance with claim 2, wherein each of said plurality of power supply layers comprises a plurality of electrically conductive plates electrically isolated from each other.

11. The substrate in accordance with claim 6, wherein each of said plurality of power supply layers comprises a plurality of electrically conductive plates.

12. A substrate for a probe card for use in testing a plurality of semiconductor IC (Integrated Circuit) devices in a lump, comprising:

a plurality of tester power supply terminals for receiving a power supply voltage output from a tester;

a plurality of power supply terminals to be connected to the plurality of IC devices to be tested; and a plurality of power supply layers each connecting one of said plurality of tester power supply terminals to one of said plurality of power supply terminals.

13. The substrate in accordance with claim 12, wherein said plurality of power supply terminals form a power supply terminal group, each of said power supply layers being connected to one of said plurality of power supply terminals of said power supply terminal group.

14. The substrate in accordance with claim 13, further comprising:

a float terminal adjoining said power supply terminal group;

a jumper wire connecting said float terminal to any one of said plurality of power supply terminals; and a probe needle connected to said float terminal and contacting a power supply pad formed on the IC devices.

15. The substrate in accordance with claim 14, wherein said float terminal comprises a plurality of float subterminals assigned to said power supply terminal group.

16. The substrate in accordance with claim 13, further comprising:

a float terminal adjoining said power supply terminal group;

a pattern conductive material connecting said float terminal to any one of said power supply terminals; and a probe needle connected to said float terminal and contacting a power supply pad formed on the IC devices.

17. The substrate in accordance with claim 12, wherein each of said plurality of power supply layers comprises at least two electrically conductive plates.

18. The substrate in accordance with claim 16, wherein each of said plurality of power supply layers comprises at least two electrically conductive plates.

* * * * *